(12) United States Patent
Hwang et al.

(10) Patent No.: US 6,660,604 B1
(45) Date of Patent: Dec. 9, 2003

(54) METHOD OF FORMING DOUBLE JUNCTION REGION AND METHOD OF FORMING TRANSFER TRANSISTOR USING THE SAME

(75) Inventors: Kyung Pil Hwang, Seoul (KR); Seoung Ouk Choi, Anyang-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/314,442

(22) Filed: Dec. 9, 2002

(30) Foreign Application Priority Data

Jul. 18, 2002 (KR) .................. 10-2002-0042173

(51) Int. Cl.[7] .................. H01L 21/336; H01L 21/8242; H01L 21/8234
(52) U.S. Cl. .................. 438/305; 438/197; 438/255; 438/258
(58) Field of Search .................. 438/305, 197, 438/233, 255, 258, 526

(56) References Cited

U.S. PATENT DOCUMENTS

| | | | | |
|---|---|---|---|---|
| 5,994,733 A | * | 11/1999 | Nishioka et al. | 257/316 |
| 6,162,668 A | * | 12/2000 | Oda et al. | 438/197 |
| 6,245,608 B1 | * | 6/2001 | Lin et al. | 438/233 |
| 6,245,625 B1 | * | 6/2001 | Gau | 438/305 |
| 6,417,081 B1 | * | 7/2002 | Thurgate | 438/526 |
| 6,512,258 B2 | * | 1/2003 | Maeda | 438/255 |
| 6,562,683 B1 | * | 5/2003 | Wang et al. | 438/258 |

* cited by examiner

Primary Examiner—John F. Niebling
Assistant Examiner—Walter L. Lindsay, Jr.
(74) Attorney, Agent, or Firm—Morgan, Lewis & Bockius LLP

(57) ABSTRACT

The present invention relates to a method of forming a dual junction region and a method of forming a transfer transistor using the same. A low-concentration junction region is formed. A high-concentration junction region is formed at a portion of the low-concentration junction region by performing a high-concentration ion implantation process an ion implantation mask for an interlayer dielectric film in which a contact hole is formed so that the portion of the low-concentration junction region is exposed. With this structure, the distance between the high-concentration junction region and the well is sufficiently secured by controlling the distance between the high-concentration junction region and the well using the width of the contact hole formed in the interlayer dielectric film. Therefore, a stable characteristic can be secured upon application of a subsequent high voltage bias.

17 Claims, 5 Drawing Sheets

US 6,660,604 B1

METHOD OF FORMING DOUBLE JUNCTION REGION AND METHOD OF FORMING TRANSFER TRANSISTOR USING THE SAME

BACKGROUND OF THE INVENTION

1. Field of the Invention

The invention relates generally to a method of forming a dual junction region and a method of forming a transfer transistor using the same, and more particularly to, a dual junction region of a NAND type flash memory device that stably operates in a high voltage bias, and a method of forming a transfer transistor using the same.

2. Description of the Prior Art

In a NAND type flash memory device, program and erase operations are performed through processes in which electrons are injected into a floating gate and the injected electrons are then drawn by means of FN (Fowler/Nordheim) tunneling. The program and erase operations of the flash memory device are performed by applying a high voltage bias of over 20V between two electrodes of a selected memory cell, i.e., a control gate and a substrate.

As described in the above, in order to apply the high voltage bias to the selected memory cell, a transistor for transferring the high voltage bias (hereinafter, called 'transfer transistor') is required. In other words, in order to smoothly perform the program and erase operations of the selected memory cell, it is required that the high voltage bias supplied from the outside be transferred to the word lines of the selected memory cell without loss. For this, the transfer transistor is required.

The transfer transistors, known so far, have a dual junction region structure in which a low-concentration doping junction region (hereinafter, called 'low-concentration junction region') and a high-concentration doping junction region (hereinafter, called 'high-concentration junction region') are formed within a substrate in which wells are formed. A method of manufacturing the dual junction region of the transfer transistor will be described by reference to FIG. 1 through FIG. 3.

Referring now to FIG. 1, wells (not shown) are formed in the semiconductor substrate 102 through a well process. Next, a gate electrode 108 having a structure on which, a gate oxide film 104 and a polysilicon layer 106 are stacked is formed on the semiconductor substrate 102 by means of given deposition process and etch process. A low-concentration junction region 110 is formed in the semiconductor substrate 102 exposed between neighboring gate electrodes 108 by means of a low-concentration doping implantation.

By reference to FIG. 2, spacers 112 are formed at both sidewalls of the gate electrode 108. Next, a high-concentration junction region 114 is formed within the low-concentration junction region 110 by means of a high-concentration doping implantation process using the spacers 112 as an ion implantation mask. Thereby, the dual junction region 116 consisting of the low-concentration junction region 110 and the high-concentration junction region 114 is formed in the semiconductor substrate 102.

Referring now to FIG. 3, an interlayer dielectric film 118 through which a portion of the high-concentration junction region 114 is exposed is formed on the semiconductor substrate 102. Next, a plug junction region 120 (i.e., region connected to a metal wiring) is formed in the exposed portion of the high-concentration junction region 114 by means of a plug doping implantation process using the interlayer dielectric film 118 as an ion implantation mask. Thereby, the transfer transistor including the dual junction region 116 and the gate electrode 108 is completed.

As described, however, in the transfer transistor having the structure of the dual junction region, if the high voltage bias of over 20V is transferred, a breakdown phenomenon is easily generated between the well within the semiconductor substrate 102 and the dual junction region 116. Due to this, the high voltage bias to be transferred could not be normally transferred. Generally, it has been reported that the transfer transistor of the dual junction region structure can transfer a high voltage bias of 17V by maximum. However, there are problems that the program and erase operations of the selected memory cell could not be sufficiently efficiently performed and the device characteristic is degraded, under this voltage.

As described above, the breakdown phenomenon between the well of the transfer transistor and the dual junction region of the dual junction region is more easily generated when the difference in the doping concentrations of the regions having difference dopants is large. Also, as the distance between the well and the high-concentration junction region at the dual junction region (see 'D' in FIG. 3) is close, an avalanche breakdown phenomenon is easily generated. Therefore, the high voltage bias could not be normally transferred. This is because the breakdown voltage between the dual junction region and the well does not endure the high voltage bias of 20V since the well region is diffused into the high-concentration junction region as the distance between the well and the high-concentration junction region is close when the high voltage bias is applied, as indicated by an portion 'A' in FIG. 4. Also, the gate oxide film (see 'T' in FIG. 4) is usually formed in thickness of 150 through 200Å, which does not also endure the high voltage bias of 20V. Thus, the breakdown phenomenon is generated.

SUMMARY OF THE INVENTION

The present invention is contrived to solve the above problems and an object of the present invention is to form a transfer transistor that stably operates in a high voltage bias.

Another object of the present invention is to provide a transfer transistor capable of improving program and erase operations of a memory cell.

In order to accomplish the above object, a method of forming the dual junction region according to the present invention, is characterized in that it comprises the steps of performing a low-concentration doping implantation process for a semiconductor substrate in which several structural layers are formed, thus forming a low-concentration junction region in the semiconductor substrate exposed between the structural layers, depositing an insulating film on the entire structure and then etching the insulating film so that a portion of the low-concentration junction region is exposed, thus forming a contact hole, and performing a high-concentration ion implantation process to form a high-concentration junction region in the portion of the low-concentration junction region exposed through the contact hole.

In order to accomplish another object, a method of forming the transfer transistor according to the present invention, is characterized in that it comprises the steps of forming a gate electrode on a semiconductor substrate in which a well is formed, performing a low-concentration doping implantation process to form a low-concentration junction region in the semiconductor substrate, depositing an insulating film on the entire structure and then etching the insulating film so that a portion of the low-concentration junction region is exposed, thus forming a contact hole, and performing a high-concentration ion implantation process to form a high-concentration junction region in the low-concentration junction region exposed through the contact hole.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
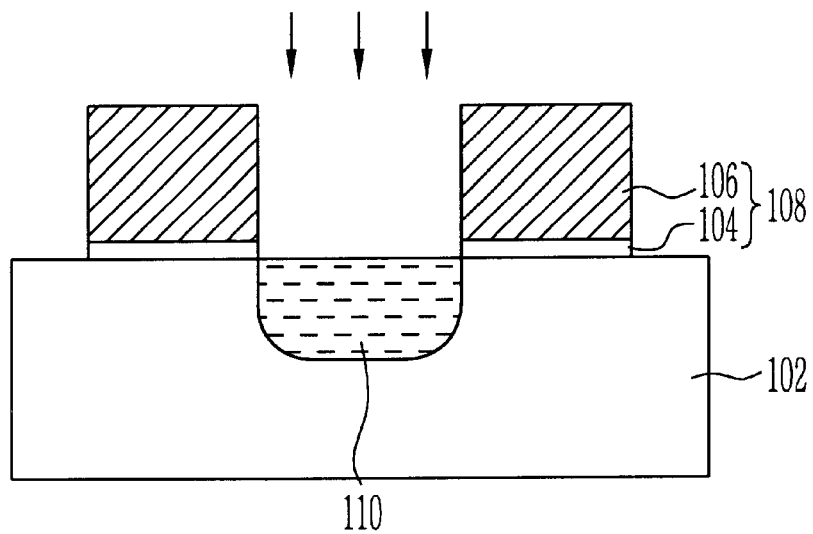
FIG. 1 through FIG. 3 are cross sectional views of transfer transistors in NAND type flash memories for explaining a conventional method of forming the transfer transistor.
Figure 2:
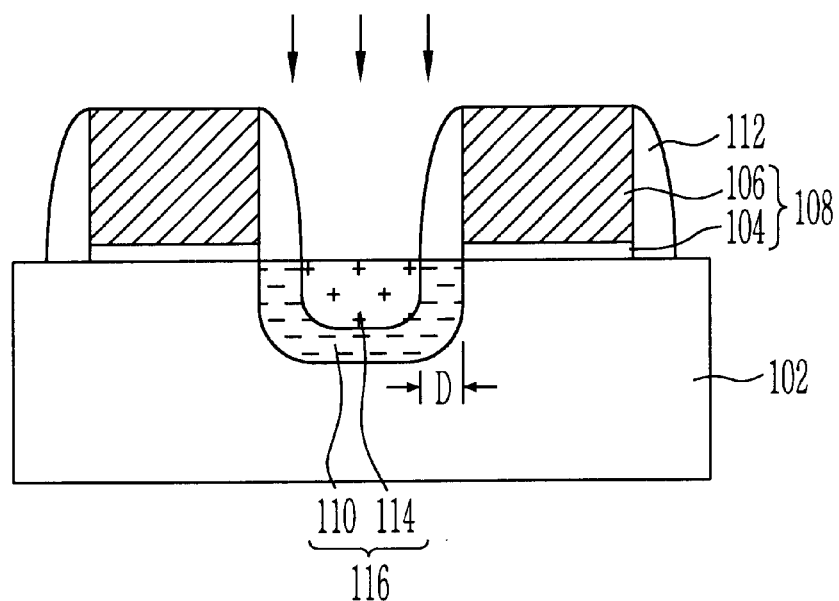
Figure 3:
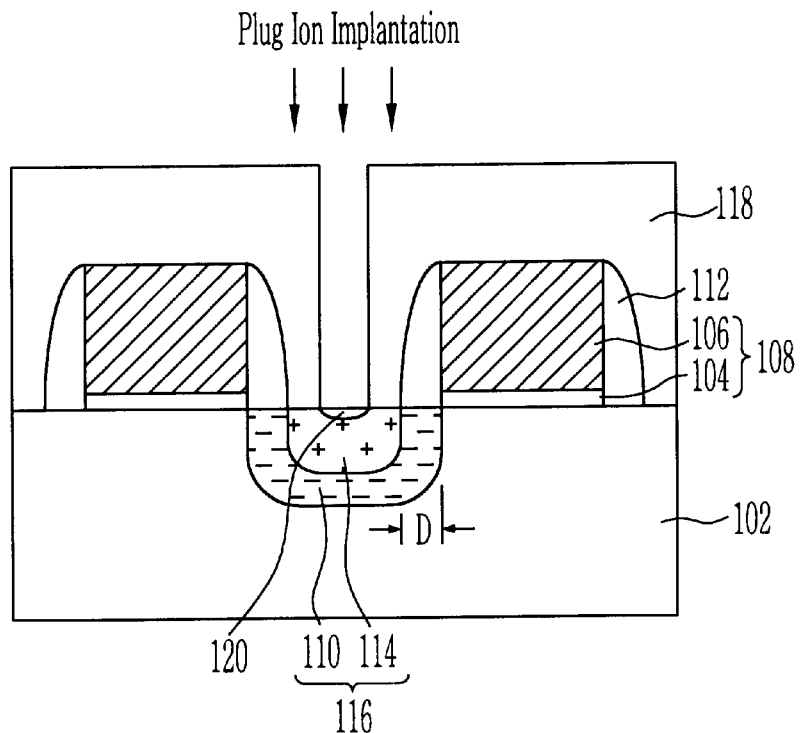
Figure 4:
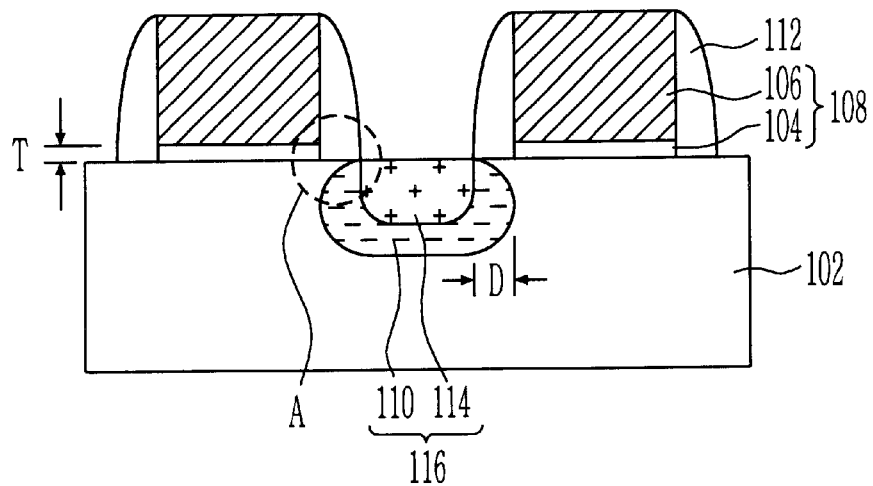
FIG. 4 is a cross sectional view of the transfer transistor for explaining problems in the transfer transistor formed conventionally.

The present invention will be described in detail by way of a preferred embodiment with reference to accompanying drawings, in which like reference numerals are used to identify the same or similar parts.

FIG. 5 through FIG. 10 are cross sectional views of transfer transistors in NAND type flash memories for explaining a method of forming the transfer transistor according to a preferred embodiment of the present invention.

Figure 5:
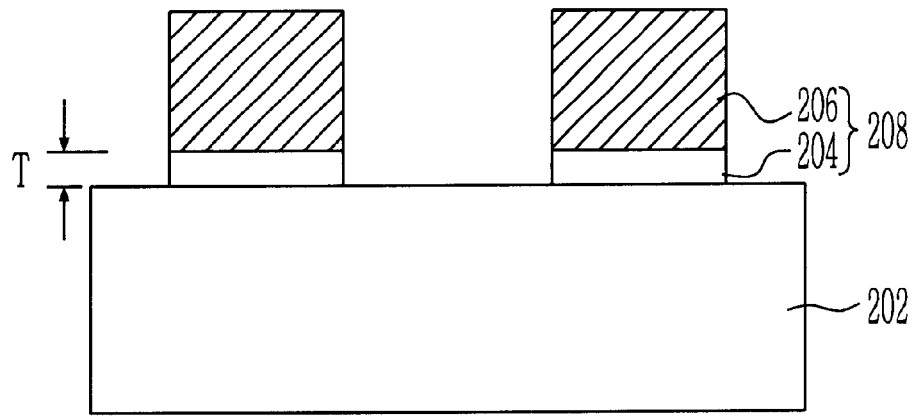
FIG. 5 through FIG. 10 are cross sectional views of transfer transistors in NAND type flash memories for explaining a method of forming the transfer transistor according to a preferred embodiment of the present invention.

Referring now to FIG. 5, phosphorous ions of an 'n' impurity are injected into a given portion of a P type semiconductor substrate 202, thus forming a N-well (not shown). At this time, it is preferred that the ion implantation process for forming the N-well is performed so that the concentration of the N-well is low by maximum. Meanwhile, the P type semiconductor substrate 202 is formed by an ion implantation process in which boron ions are used, the dose is $1E11 ions/cm^2$ and the ion implantation energy is 150 KeV.

Next, a gate oxide film 204 and a polysilicon layer 206 are sequentially deposited on the entire structure. At this time, the gate oxide film 204 has a structure on which a silicon oxide film ($SiO_2$), a silicon nitride film (SiN), a silicon oxide film and a silicon nitride film are stacked. Also, it is preferred that the gate oxide film 204 is formed in thickness of at least 300Å, preferably over 300 through 500Å so that it can endure a high voltage bias of over 20V.

Thereafter, a photoresist (not shown) is coated on the entire structure. A photoresist pattern (not shown) is then formed by an exposure process and a development process using a photo mask (not shown).

Then, the polysilicon layer 206 and the gate oxide film 204 are sequentially patterned by an etch process using the photoresist pattern, thus forming a gate electrode 208 of a stack structure. Next, the photoresist pattern is removed by a given strip process.

Figure 6:
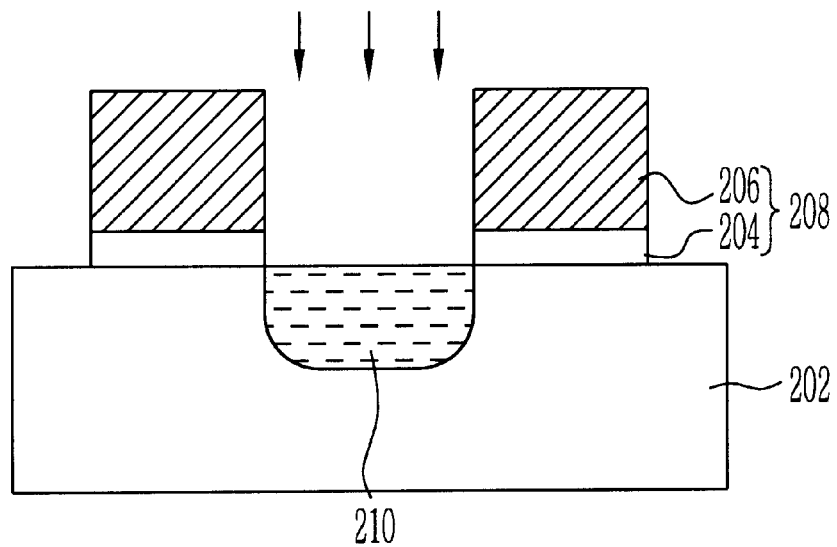

Referring now to FIG. 6, a low-concentration junction region 210 is formed in the semiconductor substrate 202 exposed between the gate electrodes 208 by means of a low-concentration doping implantation process. At this time, it is preferred that the low-concentration doping implantation process is performed using phosphorous (P) or arsenic (As) ions at the dose of below $1E13 ions/cm^2$, preferably $1E10$ through $1E13 ions/cm^2$, for example, $5E12 ions/cm^2$, $5E11 ions/cm^2$, $1E11 ions/cm^2$, $1E11 ions/cm^2$ or $1E13 ions/cm^2$. Also, it is preferred that the low-concentration doping implantation process is performed at the ion implantation energy of below 90 KeV, preferably 50 through 90 KeV, for example, 50 KeV, 60 KeV, 70 KeV, 80 KeV or 90 KeV.

Figure 7:
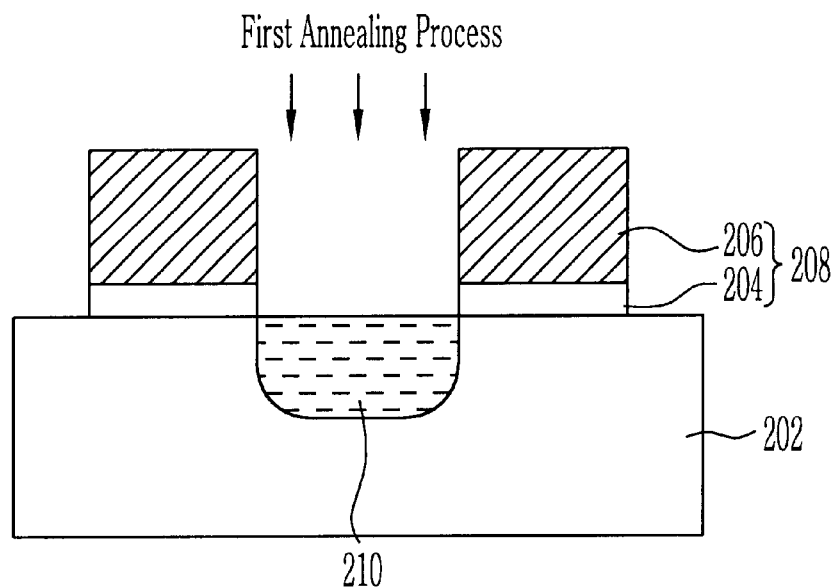

Referring now to FIG. 7, in order to activate/diffuse the ions injected into the low-concentration junction region 210, an annealing process (hereinafter, called 'first annealing process') is performed on the entire structure. At this time, the first annealing process is performed using a furnace mode or a rapid temperature process mode (RTP) under oxygen ($O_2$), nitrogen ($N_2$) or an ambient in which oxygen and nitrogen are mixed at a given ratio. The process conditions in the first annealing process are indicated in Table 1.

TABLE 1

|  | Furnace Mode | | | RTP Mode | | |
| --- | --- | --- | --- | --- | --- | --- |
|  | $O_2$ | $N_2$ | $O_2 + N_2$ | $O_2$ | $N_2$ | $O_2 + N_2$ |
| Target (Å) | 50 | 50 | 50 | 50 | 50 | 50 |
| Temperature (° C.) | 750 through 950 | 600 through 950 | 600 through 950 | 850 through 950 | 600 through 950 | 850 through 950 |
| Process Time | 10 Min through 8 Hr | 10 Min through 8 Hr | 10 Min through 8 Hr | 5 Sec through 10 Min | 5 Sec through 10 Min | 5 Sec through 10 Min |
| Mixed Ratio | 10SLM | 0.05SLM | 10SLM ($O_2$), 0.5SLM ($N_2$) | 10SLM | 0.05SLM | 10SLM ($O_2$), 0.5SLM ($N_2$) |
| Rate of Temperature Increased (° C./Min) |  |  |  | 10 through 50 | 10 through 50 | 10 through 50 |

Figure 8:
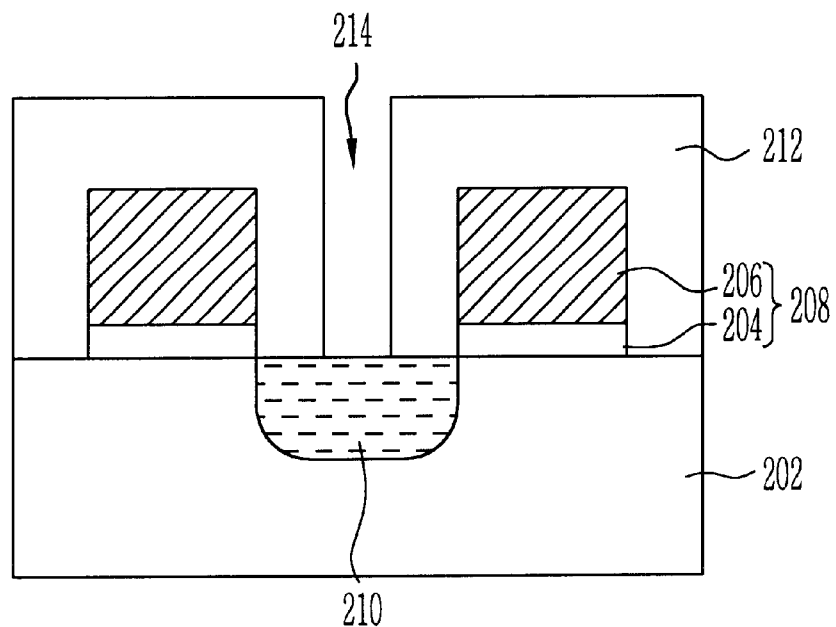

Referring now to FIG. 8, an interlayer dielectric (ILD) film 212 made of SOG (spin on glass), USG (un-doped silicate glass), BPSG (boron-phosphorus silicate glass), PSG (phosphorus silicate glass), PETEOS (plasma enhanced tetra ethyl ortho silicate glass) or IPO (inter poly oxide) is formed on the entire structure.

Next, a photoresist (not shown) is coated on the entire structure. A photoresist pattern (not shown), which defines a region where a subsequent contact plug (i.e., plug electrically connecting a metal wiring and a junction region) will be formed, is formed by an exposure process and a development process using a photo mask (not shown).

Then, the interlayer dielectric film 212 is etched by an etch process using the photoresist pattern. Thereby, a contact hole 214 through a portion of the low-concentration junction region 210 is exposed is formed.

Figure 9:
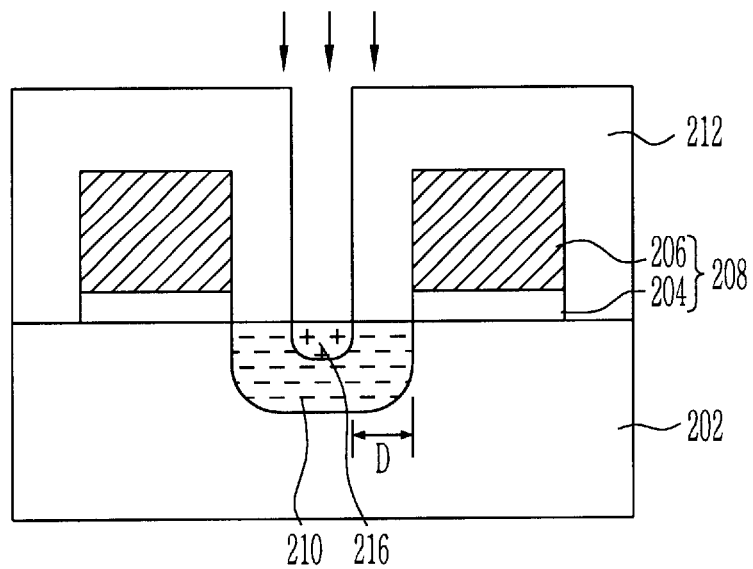

Referring now to FIG. 9, a high-concentration junction region 216 is formed in the portion of the low-concentration junction region 210 that is exposed through the contact hole 214, using a high-concentration ion implantation process. At this time, it is preferred that the high-concentration ion implantation process is performed using phosphorous (P) or arsenic (As) ions at the dose of below $5E15 ions/cm^2$, preferably $1E12$ through $1E15 ions/cm^2$, for example, $E12 ions/cm^2$, $5E12 ions/cm^2$, $1E13 ions/cm^2$, $5E13 ions/cm^2$, $1E14 ions/cm^2$, $5E14 ions/cm^2$, $1E15 ions/cm^2$ or $5E15 ions/cm^2$. Also, it is preferred that the high-concentration ion implantation process is performed at the ion implantation energy of below 40 KeV, preferably 5 through 40 KeV, for example, 5 KeV, 10 KeV, 15 KeV, 20 KeV, 25 KeV, 30 KeV, 35 KeV or 40 KeV.

As the distance 'D' between the high-concentration junction region 216 and the well region is sufficiently kept, a sufficient breakdown voltage could be obtained between the high-concentration junction region 216 and the well region. Accordingly, upon application of the high voltage bias, the breakdown phenomenon at this portion is prohibited by maximum.

Figure 10:
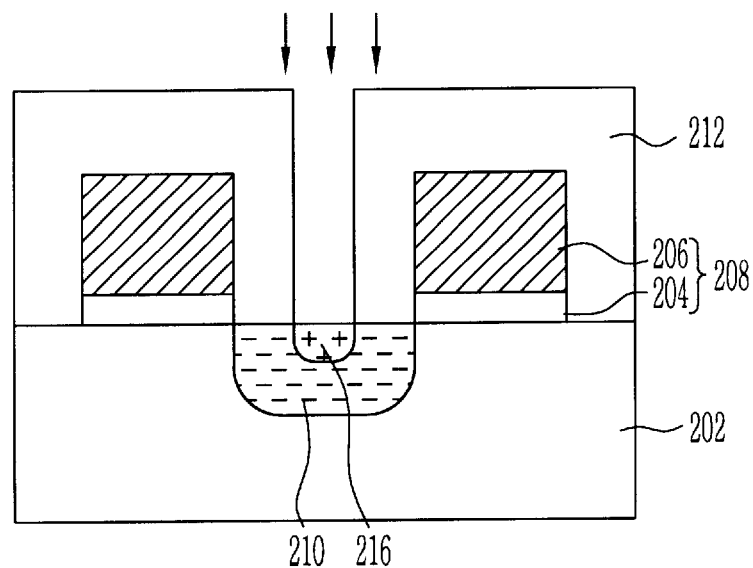

Referring to FIG. 10, in order to activate the ions injected into the high-concentration junction region 216, an annealing process (hereinafter, called 'second annealing process') is performed. At this time, the second annealing process includes performing a furnace process, a rapid temperature process (RTP) or an annealing process and is performed under oxygen ($O_2$), nitrogen ($N_2$) or an ambient in which oxygen and nitrogen are mixed at a given ratio. The process conditions in the second annealing process are indicated in Table 2.

As described above, according to the present invention, when a well is formed in a semiconductor substrate, the well is formed so that the concentration of the well is low by maximum. Thus, the present invention has an advantageous effect that it can form a transfer transistor that stably operates in a high voltage bias since a breakdown voltage between the well and a high-concentration junction region is obtained by maximum.

Further, the gate oxide film is formed in thickness of at least 300Å. Therefore, the present invention has an outstanding effect that it can form a transfer transistor that stably operates by prohibiting breakdown of the gate oxide film upon application of a high voltage bias.

In addition, according to the present invention, a low-concentration junction region is formed and an interlayer dielectric film for forming a subsequent contact plug is formed. Next, a high-concentration junction region is formed by a high-concentration ion implantation process using an ion implantation mask. Thus, the present invention has an advantageous effect that it can secure a sufficient distance between the high-concentration junction region and the well by controlling the distance of the high-concentration junction region and the well using the width of the contact hole formed in the interlayer dielectric film.

Also, the present invention has an advantageous effect that it can form a transfer transistor that stably operates in the high voltage bias by sufficiently securing the distance between the high-concentration junction region and the well through the above process.

Further, as the high-concentration junction region is formed through the above process, spacers at both sides of a gate electrode, which was used as a mask, do not need to be formed upon a conventional high-concentration ion implantation process. Thus, the present invention has an advantageous effect that it can simplify the entire process.

Also, the transfer transistor that stably operates in the high voltage bias is formed through the above process. Therefore, the present invention has an advantageous effect that it can improve the efficiency of the program and erase operations for the memory cell.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

TABLE 2

| | Furnace Mode | | | RTP Mode | | |
|---|---|---|---|---|---|---|
| | $O_2$ | $N_2$ | $O_2 + N_2$ | $O_2$ | $N_2$ | $O_2 + N_2$ |
| Target (Å) | 50 | 50 | 50 | 50 | 50 | 50 |
| Temperature (° C.) | 750 through 950 | 600 through 950 | 600 through 950 | 850 through 950 | 600 through 950 | 850 through 950 |
| Process Time | 10 Min through 8 Hr | 10 Min through 8 Hr | 10 Min through 8 Hr | 5 Sec through 10 Min | 5 Sec through 10 Min | 5 Sec through 10 Min |
| Mixed Ratio | 10SLM | 0.05SLM | 10SLM ($O_2$), 0.5SLM ($N_2$) | 10SLM | 0.05SLM | 10SLM ($O_2$), 0.5SLM ($N_2$) |
| Rate of Temperature Increased (° C./Min) | | | | 10 through 50 | 10 through 50 | 10 through 50 |

What is claimed is:

1. A method of forming a dual junction region, comprising the steps of:

(a) performing a low-concentration doping implantation process for a semiconductor substrate in which several structural layers are formed, thus forming a low-concentration junction region in the semiconductor substrate exposed between the structural layers;

(b) depositing an insulating film on the entire structure and then etching the insulating film so that a portion of the low-concentration junction region is exposed, thus forming a contact hole; and (c) performing a high-concentration ion implantation process to form a high-concentration junction region in the portion of the low-concentration junction region exposed through the contact hole.

2. The method as claimed in claim 1, wherein the low-concentration doping implantation process is performed using phosphorous or arsenic ions at the dose of 1E10 through 1E13ions/cm$^2$ and the ion implantation energy of 50 through 90 KeV.

3. The method as claimed in claim 1, further comprising the step of performing an annealing process using a furnace mode or a rapid temperature process mode for the low-concentration junction region, after the step (a).

4. The method as claimed in claim 3, wherein the furnace mode and the rapid temperature process mode are performed under $O_2$, $N_2$ or an ambient in which $O_2$ and $N_2$ are mixed.

5. The method as claimed in claim 3, wherein the furnace mode is performed under an $O_2$ gas ambient at a temperature of 750 through 950° C. for a process time of 10 minutes through 8 hours.

6. The method as claimed in claim 3, wherein the furnace mode is performed under a $N_2$ gas ambient at a temperature of 600 through 950° C. for a process time of 10 minutes through 8 hours.

7. The method as claimed in claim 3, wherein the furnace mode is performed under an ambient in which $O_2$ and $N_2$ are mixed at 0.05 to 10SLM at a temperature of 600 through 950° C. for a process time of 10 minutes through 8 hours.

8. The method as claimed in claim 3, wherein the rapid temperature process mode is performed under an $O_2$ gas ambient under the conditions that the rate of a temperature increased is 10 through 50° C./Min, the final temperature is 550 through 950° C. and a process time is 5 seconds through 10 minutes.

9. The method as claimed in claim 3, wherein the rapid temperature process mode is performed under a $N_2$ gas ambient under the conditions that the rate of a temperature increased is 10 through 50° C./Min, the final temperature is 600 through 950° C. and a process time is 10 minutes through 8 hours.

10. The method as claimed in claim 3, wherein the furnace mode is performed under an ambient in which $O_2$ and $N_2$ are mixed at 0.05 to 10 SLM under the conditions that the rate of a temperature increased is 10 through 50° C./Min, the final temperature is 600 through 950° C. and a process time is 10 minutes through 8 hours.

11. The method as claimed in claim 1, wherein the high-concentration ion implantation process is performed using phosphorous or arsenic at the dose of 1E12 through 5E15 ions/cm$^2$ and the ion implantation energy of 5 through 40 KeV.

12. A method of forming a transfer transistor, comprising the steps of:

(a) forming a gate electrode on a semiconductor substrate in which a well is formed;

(b) performing a low-concentration doping implantation process to form a low-concentration junction region in the semiconductor substrate;

(c) depositing an insulating film on the entire structure and then etching the insulating film so that a portion of the low-concentration junction region is exposed, thus forming a contact hole; and (d) performing a high-concentration ion implantation process to form a high-concentration junction region in the low-concentration junction region exposed through the contact hole.

13. The method as claimed in claim 12, wherein the gate electrode has a structure on which a gate oxide film and a polysilicon layer are stacked.

14. The method as claimed in claim 13, wherein the gate oxide film has a stack structure of a silicon oxide film, a silicon nitride film, a silicon oxide film and a silicon nitride film, or a stack structure of a silicon oxide film and a nitride film.

15. The method as claimed in claim 13, wherein the gate oxide film is formed in thickness of 300 through 500Å, considering that the gate oxide film can be broken upon application of a subsequent high voltage bias.

16. The method as claimed in claim 12, wherein the width of the high-concentration junction region is determined by the width of the contact hole.

17. The method as claimed in claim 12, wherein the contact hole has a contact plug for electrically connecting a subsequent upper metal wiring and the high-concentration junction region.

* * * * *